(12) United States Patent
Saito et al.

(10) Patent No.: US 6,691,430 B2
(45) Date of Patent: Feb. 17, 2004

(54) HIGH-PRESSURE DRYING APPARATUS, HIGH-PRESSURE DRYING METHOD AND SUBSTRATE PROCESSING APPARATUS

(75) Inventors: Kimitsugu Saito, Kyoto (JP); Yusuke Muraoka, Kyoto (JP); Ryuji Kitakado, Kyoto (JP); Takashi Miyake, Kyoto (JP); Tomomi Iwata, Kyoto (JP); Ikuo Mizobata, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/382,616

(22) Filed: Mar. 4, 2003

(65) Prior Publication Data

US 2003/0177659 A1 Sep. 25, 2003

(30) Foreign Application Priority Data

Mar. 25, 2002 (JP) ........................................ 2002-083046

(51) Int. Cl.$^7$ ................................................. F26B 7/00
(52) U.S. Cl. ............................... 34/389; 34/527; 34/68; 34/218; 134/902
(58) Field of Search .......................... 34/381, 389, 426, 34/448, 526, 527, 60, 68, 218; 134/902

(56) References Cited

U.S. PATENT DOCUMENTS

| | | | |
|---|---|---|---|
| 5,367,490 A | * 11/1994 | Akimoto et al. | ............ 365/194 |
| 5,700,379 A | 12/1997 | Biebl | .............................. 216/2 |
| 6,164,297 A | * 12/2000 | Kamikawa | .................... 134/61 |
| 6,319,329 B1 | * 11/2001 | Kamikawa et al. | ............. 134/2 |
| 6,332,723 B1 | * 12/2001 | Matsuyama et al. | ......... 396/571 |
| 6,375,758 B1 | * 4/2002 | Nakashima et al. | ........... 134/30 |

FOREIGN PATENT DOCUMENTS

| | | |
|---|---|---|
| JP | 8-250464 | 9/1996 |
| JP | 9-139374 | 5/1997 |
| JP | 2000-91180 | 3/2000 |
| JP | 2000-223467 | 8/2000 |

* cited by examiner

Primary Examiner—Ira S. Lazarus
Assistant Examiner—Kathryn S. O'Malley
(74) Attorney, Agent, or Firm—Ostrolenk, Faber, Gerb & Soffen, LLP (57) ABSTRACT

Liquid for prevention of substrate drying is supplied into a processing chamber so that a pool of the liquid is created as an anti-drying atmosphere in advance inside a processing chamber, and substrates, as they are dipped in the pool, are kept on stand-by in a substrate board. In this manner, air drying of the substrates which are kept on stand-by is prevented. When the number of the substrates in the substrate board reaches a certain number, the anti-drying atmosphere is removed from the processing chamber, which is followed by introduction of an SCF into the processing chamber and supercritical drying (high pressure drying) of all of the plurality of substrates inside the processing chamber, namely, batch supercritical drying.

15 Claims, 6 Drawing Sheets

HIGH-PRESSURE DRYING APPARATUS, HIGH-PRESSURE DRYING METHOD AND SUBSTRATE PROCESSING APPARATUS

BACKGROUND OF THE INVENTION

1. Field of the Invention

The present invention relates to a high pressure drying apparatus and a high pressure drying method in which a high pressure fluid or a mixture of a high pressure fluid and a chemical agent as a processing fluid is supplied to substrates, to thereby dry the substrates under a high pressure. The present invention relates also to a substrate processing apparatus comprising such a high pressure drying apparatus. The substrates include a semiconductor wafer, a glass substrate for photomask, a glass substrate for liquid crystal display, a glass substrate for plasma display and an optical disk substrate

2. Description of the Related Art

While electronic components such as semiconductor devices are becoming increasingly finer these days at an accelerating rate, there are new problems arising because of this during processing of substrates. For example, a developing process, a rinsing process and a drying process are performed in this order to form very fine patterns by means of patterning of a resist which is applied on a substrate. During an alkaline developing process for development of the resist applied on the substrate, an alkaline solution is used for removal of an unwanted resist. During rinsing, a rinse liquid such as pure water is used to remove the alkaline solution (to stop developing). During drying, the substrate is rotated to thereby make centrifugal force act upon the rinse liquid, the rinse liquid remaining on the substrate is accordingly removed, and the substrate is dried (spin drying). Of these processes, during the drying process, the interface between the rinse liquid and gas appears on the substrate as drying proceeds. If the interface appears at a gap between very fine patterns of a semiconductor device, the surface tension of the rinse liquid pulls the very fine patterns toward each other and collapses the very fine patterns, which is a problem.

It is also considered that the collapse of the very fine patterns is attributed to the flow resistance created at the time of spin drainage of the rinse liquid, the applied pressure developed at the time of ejection of the rinse liquid out from the very fine patterns, the air resistance and the centrifugal force due to the high-speed rotations beyond 3000 rpm, etc.

Proposed as a solution of this problem is supercritical drying during which a substrate is held inside a pressure container, a supercritical fluid (hereinafter referred to as "SCF") which has low viscosity, high diffusivity and no surface tension is introduced into the pressure container, and the substrate is subjected to supercritical drying. One such a conventional technique is a supercritical drying apparatus described in Japanese Patent Application Laid-Open Gazette No. 2000-223467. This supercritical drying apparatus is capable of holding a developed and rinsed substrate inside a reaction chamber. A pump unit is activated with a substrate held, a constant amount of liquefied carbon dioxide is pumped under pressure into the reaction chamber from a cylinder, the pressure of carbon dioxide inside the reaction chamber is automatically controlled by means of a pressure control valve, the pressure of carbon dioxide inside the reaction chamber accordingly becomes 7.38 through 8 MPa, and carbon dioxide inside the reaction chamber consequently becomes a supercritical fluid. Supercritical carbon dioxide is thereafter released from the reaction chamber and the pressure inside the reaction chamber is reduced, whereby the substrate is dried.

By the way, the supercritical drying apparatus described above is a drying apparatus of the single wafer type which performs only drying. Therefore, after a different developing apparatus which is separate from the supercritical drying apparatus develops and rinses one substrate, this substrate is fed into the supercritical drying apparatus by a transportation apparatus and dried. Thus, a developing apparatus, a transportation apparatus and a supercritical drying apparatus are disposed within a conventional substrate processing apparatus, and substrates are processed one by one in each one of the developing apparatus and the supercritical drying apparatus. In short, the developing apparatus and the supercritical drying apparatus are both of the single wafer type.

As for comparison of a processing time per production lot between the developing apparatus and the supercritical drying apparatus, the processing time of the supercritical drying apparatus is longer than that of the developing apparatus. It is a reason that the supercritical drying apparatus requires an operation of increasing the pressure inside a reaction chamber and generating a supercritical fluid for the purpose of supercritical drying and thereafter releasing the supercritical fluid and decreasing the pressure inside the reaction chamber. Hence, the supercritical drying step becomes a causes of the throughput-determining of the substrate processing apparatus as a whole.

SUMMARY OF THE INVENTION

A major object of the present invention is to provide a high pressure drying apparatus, a high pressure drying method and a substrate processing apparatus with which it is possible to perform high pressure drying on substrates at an excellent throughput.

To achieve the object above, a high pressure drying apparatus according to the present invention comprises: a pressure container whose inside is a processing chamber; substrate housing means which is capable of housing a plurality of substrates inside the processing chamber; atmosphere creating means which provides the processing chamber with an anti-drying liquid for prevention of drying of surfaces of substrates or a vapor of the anti-drying liquid, to thereby create an anti-drying atmosphere; atmosphere removing means which removes the anti-drying atmosphere from the processing chamber; and processing fluid introducing means which introduces into the processing chamber a high pressure fluid or a mixture of a high pressure fluid and a chemical agent as a processing fluid, wherein after more than one substrate among substrates transported to the processing chamber are housed in the substrate housing means and made on stand-by in the anti-drying atmosphere, the more than one substrate housed in the substrate housing means are subjected all at once to high pressure drying.

To achieve the object above, a high pressure drying method according to the present invention comprises: a first step of supplying an anti-drying liquid, which prevents drying of surfaces of substrates, or a vapor of the anti-drying liquid to a processing chamber of a pressure container and creating an anti-drying atmosphere inside the processing chamber; a second step of receiving substrates transported to the processing chamber and making the substrates on stand-by in the anti-drying atmosphere; and a third step of removing the anti-drying atmosphere from the processing chamber after repeating the second step for a plurality of times, introducing a high pressure fluid or a mixture of a high pressure fluid and a chemical agent into the processing chamber as a processing fluid, and subjecting the substrates all at once to high pressure drying.

According to the present invention using such a structure (the high pressure drying apparatus and the high pressure drying method), more than one substrate among substrates transported to the processing chamber, as they are housed in the substrate housing means, are dried all at once under a high pressure, and therefore, the throughput dramatically improves as compared to a conventional apparatus which performs single wafer processing.

Batch type high pressure drying of drying more than one substrate all at once requires to consider the following points. Prior to high pressure drying of more than one substrate all at once, if substrates which have been already housed dry up naturally while transported substrates are housed one by one in the substrate housing means, very fine patterns pull each other and collapse because of the surface tension of the anti-drying liquid, and execution of high pressure drying accordingly becomes meaningless. On the contrary, the anti-drying atmosphere is created within the processing chamber in advance and each substrate is kept on stand-by in the anti-drying atmosphere before subjected to high pressure drying according to the present invention. Hence, air drying of the substrates which are on stand-by is prevented.

In addition, since high pressure drying is performed after each substrate is made on stand-by inside the same processing chamber without air-drying the substrates according to the present invention, it is possible to effectively reduce the footprint and a cost. The reason is as follows. An approach to merely prevent air drying of substrates before high pressure drying may be to keep the substrates on stand-by within a stand-by bath which holds a liquid up until high pressure drying, transport more than one substrate all at once from the stand-by bath to a processing chamber, and perform high pressure drying. However, this approach demands to separately dispose the stand-by bath and a transporting mechanism, which further necessitates an extra area to install these additional structures and increases a cost on the apparatus by an additional cost for the additional structures. On the contrary, since the present invention does not need such additional structures at all, the present invention is advantageous in terms of foot print and apparatus cost.

A high pressure fluid used in the present invention is preferably carbon dioxide because of the safety, the price, the easiness to be transformed into a supercritical state, etc. Water, ammonia, dinitrogen monoxide, ethanol and the like may be used, other than carbon dioxide. A high pressure fluid is used because of its high diffusion coefficient and its capability of dispersing a dissolved contaminant in a medium. As for use of a supercritical fluid in particular, the reason is that the supercritical fluid exhibits a property between gas and liquid and can further penetrate even between very fine patterns but yet does not exhibit surface tension. In addition, the density of a high pressure fluid is close to that of liquid, and a high pressure fluid can contain a far greater amount of an additive (chemical agent) than gas.

Further, a high pressure fluid referred to in the present invention is a fluid whose pressure is 1 MPa or higher. A preferable high pressure fluid is a fluid whose properties include high density, high solubility, low viscosity and high diffusivity, and a further preferable high pressure fluid is a fluid which is in a supercritical condition or a subcritical condition. Carbon dioxide may be heated to 31° C. and pressurized to 7.1 MPa or higher so that carbon dioxide will become a supercritical fluid. For a drying step in particular, a subcritical fluid (high pressure fluid) or a supercritical fluid at 5 through 30 MPa is preferably used, and it is further preferable to process with these at 7.1 through 20 MPa.

When the component of the anti-drying liquid is not compatible with a high pressure fluid, instead of using a high pressure fluid alone as a processing fluid as described above, a compatibilizer which can serve as an auxiliary which dissolves or uniformly diffuses the component of the anti-drying liquid in carbon dioxide is used as a chemical agent. In other words, it is preferable to use a mixture of supercritical carbon dioxide and a chemical agent as a processing fluid.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 1:
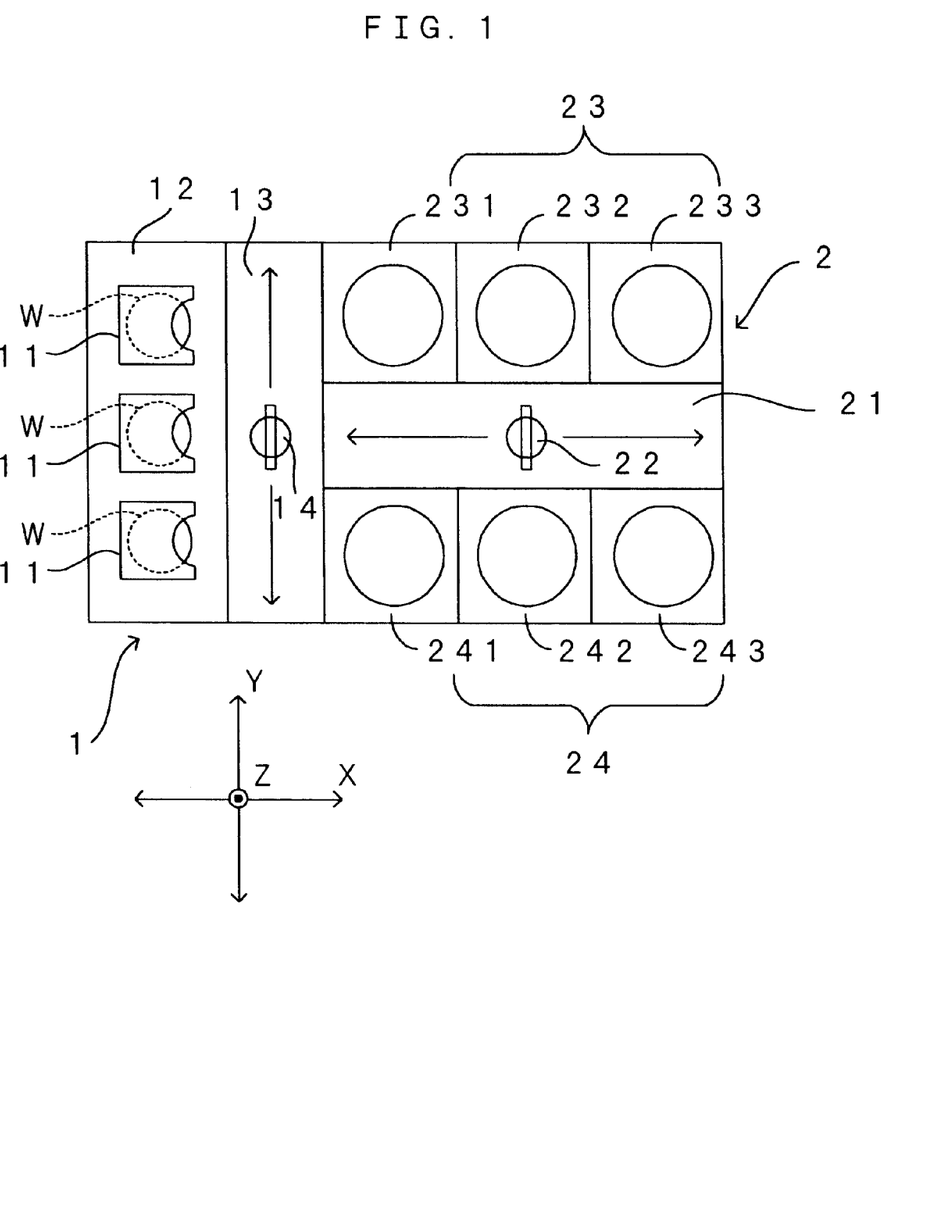
FIG. 1 is a drawing of a substrate processing apparatus which comprises a high pressure drying unit which is a first preferred embodiment of a high pressure drying apparatus according to the present invention.

FIG. 1 is a drawing of a substrate processing apparatus which comprises a high pressure drying unit which is a first preferred embodiment of a high pressure drying apparatus according to the present invention. Disposed to this substrate processing apparatus are an indexer 1 and a processing module 2 which is arranged next to the indexer 1 and on one side to the indexer 1. The indexer 1 comprises a cassette seater 12 and an indexer robot 14. The cassette seater 12 is capable of mounting a plurality of cassettes 11 each of which can house a plurality of substrates W. The indexer robot 14 is capable of moving on an indexer transportation path 13, which extends long in a direction Y, and loading the substrates W into the cassettes 11 and unloading the substrates W from the cassettes 11. The processing module 2 comprises a main transportation robot (substrate transporting unit) 22 and unit columns 23 and 24. The main transportation robot 22 moves on a main transportation path 21, which extends long in a direction X which is perpendicular to the direction Y. The unit columns 23 and 24 are arranged on the both sides to the main transportation path 21.

Processing units 231 to 233 and processing units 241 to 243 are arranged in the unit columns 23 and 24, respectively, in the direction X. According to the first preferred embodiment, the processing units 232, 233, 242 and 243 are formed by developing units (which correspond to "wet-type processing units" of the present invention) which supply a developing liquid as a processing liquid to surfaces of the substrates W for development and thereafter supply a rinse liquid for rinsing. Meanwhile, the remaining processing units 231 and 241 are high pressure drying units which subject the developed and rinsed substrates W to high pressure drying, and these high pressure drying units 231 and 241 correspond to the first preferred embodiment of the high pressure drying apparatus according to the present invention.

Figure 2:
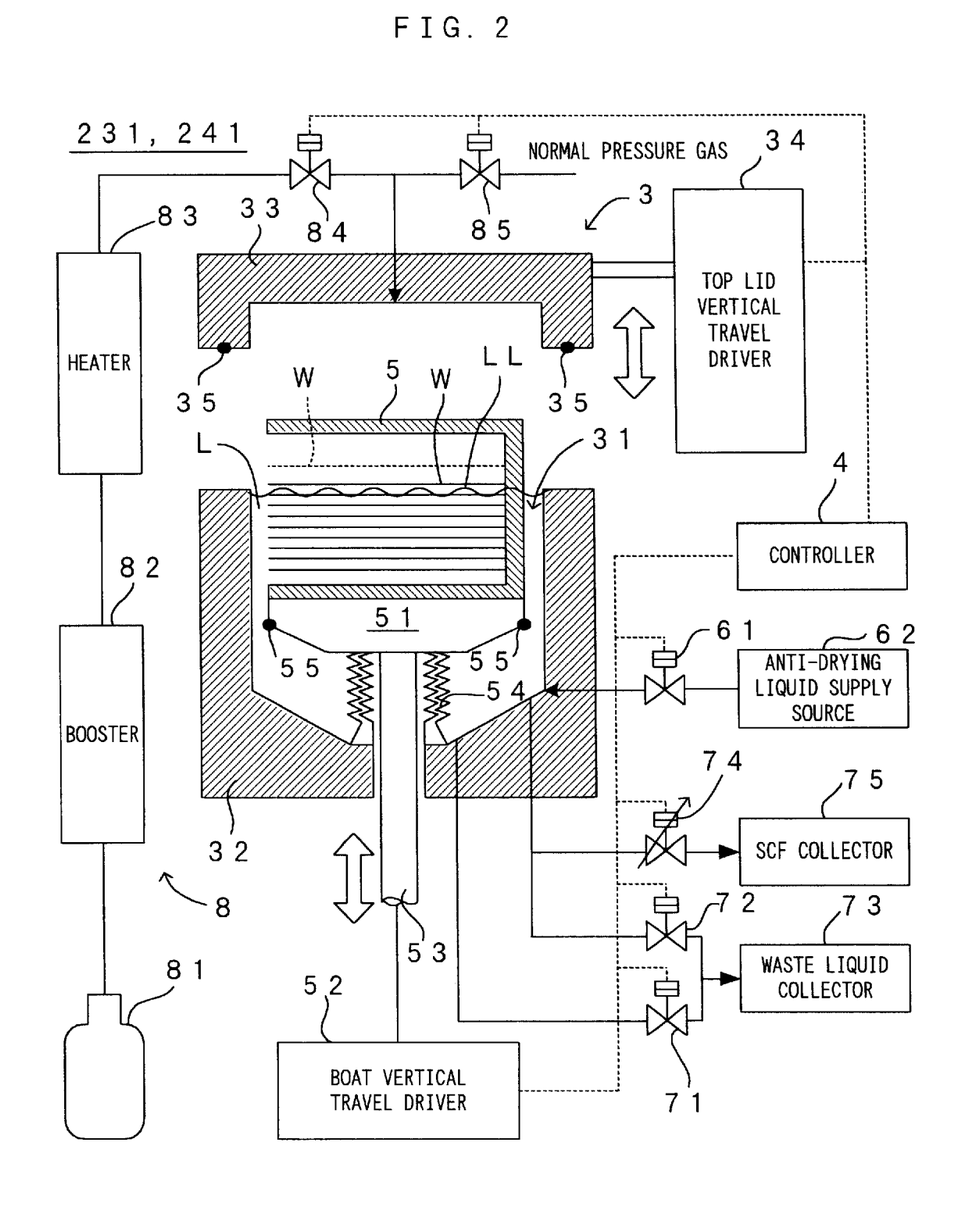
FIG. 2 is a drawing which shows a general structure of the high pressure drying unit of the substrate processing apparatus shown in FIG. 1.

FIG. 2 is a drawing which shows a general structure of the high pressure drying unit of the substrate processing apparatus which is shown in FIG. 1. The high pressure drying units 231 and 241 all have the same structure. Substrates transported one by one from the developing units 232, 233, 242 and 243 are made on stand-by to be housed in a sequential order, and when such substrates amount to a predetermined number, the high pressure drying units 231 and 241 perform high pressure drying on all of the plurality of substrates W which are on stand-by. The structure of the high pressure drying units 231 and 241 will now be described with reference to FIG. 2.

In the high pressure drying unit, substrates W are held inside a pressure container 3, that is, into a substrate boat 5 which is disposed within a processing chamber 31. To be more specific, as shown in FIG. 2, the pressure container 3 is formed by a main container part 32, which is fixed to a frame (not shown) for the high pressure drying unit, and a top lid 33 which is disposed above the main container part 32 in such a manner that the top lid 33 can ascend and descend relative to the main container part 32. A top lid vertical travel driver 34 is linked to the top lid 33, and therefore, as the top lid vertical travel driver 34 is activated in response to an operation instruction from a controller 4 which controls the entire high pressure drying unit, the top lid 33 moves up or down. For instance, when the top lid 33 is moved down by the top lid vertical travel driver 34, the top lid 33 abuts on a top circumference of the main container part 32 with a seal member 35, which is attached to a bottom circumference of the top lid 33, interposed between the top lid 33 and the main container part 32 (See FIGS. 4A through 4F which will be described later.). As a result, a concave area which is created in a top central portion of the main container part 32 joins a concave area which is created in a bottom central portion of the top lid 33, and the processing chamber 31 is defined. On the contrary, when the top lid 33 is moved up by the top lid vertical travel driver 34, the top lid 33 moves toward above and away from the main container part 32 as shown in FIG. 1, which in turn makes it possible to load the substrates W into or unload the substrates W from the substrate boat 5 which is located within the processing chamber 31.

Figure 4A:
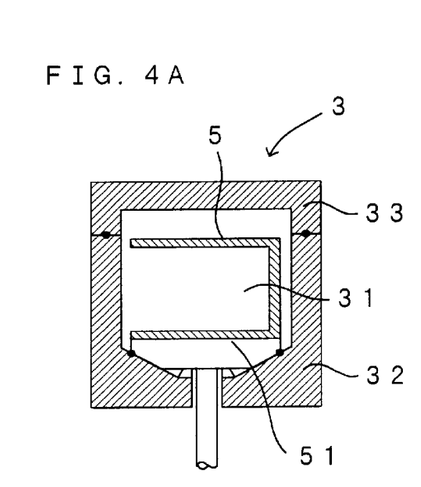
FIGS. 4A through 4F are schematic drawings which show the operations of the high pressure drying unit shown in FIG. 2.
Figure 4B:
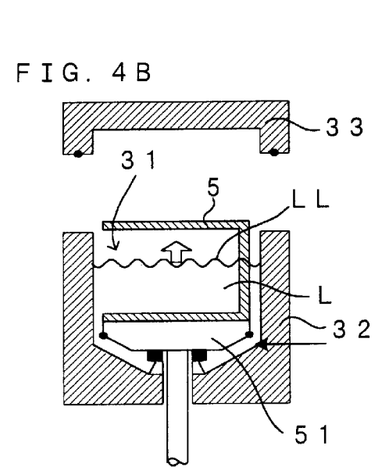
Figure 4C:
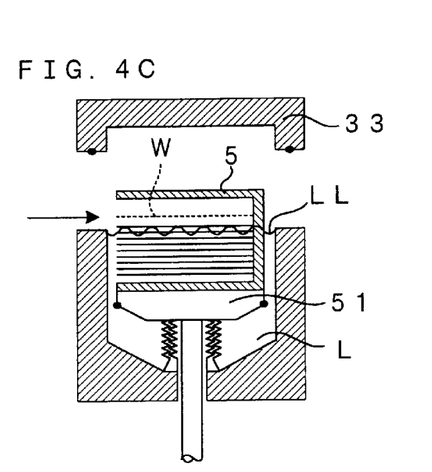
Figure 4D:
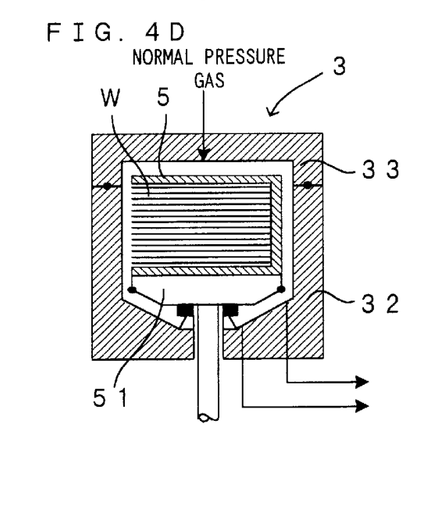
Figure 4E:
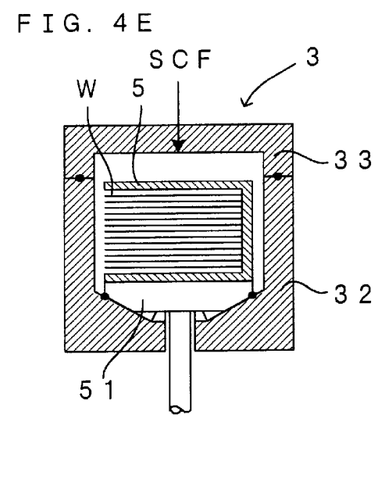

The substrate boat 5 has a cross section which is approximately shaped like the letter "U," and the substrate boat 5 is fixed on a boat holding stage 51 with the opening of the substrate boat 5 directed toward the main transportation path 21. The substrate boat 5 and the boat holding stage 51 are disposed in such a manner that the substrate boat 5 and the boat holding stage 51 can freely ascend and descend as one unit inside the processing chamber 31. As a boat vertical travel driver 52 operates in accordance with an operation instruction from the controller 4, the substrate boat 5 is positioned in the vertical direction. In other words, in the first preferred embodiment, the substrate boat 5 and the boat holding stage 51 constitute "substrate housing means" of the present invention. And as shown in FIG. 1, the substrate boat 5 can receive substrates W in a condition that the substrate boat 5 locally protrudes beyond the top circumference of the main container part 32. That is, the position shown in FIG. 1 is a substrate receiving position. Meanwhile, when the boat holding stage 51 is moved down to an inner bottom portion of the main container part 32, as shown in FIGS. 4A and 4E, the substrate boat 5 comes to be entirely housed within the processing chamber 31 and is positioned at such a position at which the substrate boat 5 can be subjected to high pressure drying, namely, a drying position. The boat vertical travel driver 52 positions the substrate boat 5 and the boat holding stage 51 not only to the two positions described above but to an intermediate position (which is shown in FIGS. 4B and 4D) as well according to the first preferred embodiment, and the reason of this will be described later.

The boat vertical travel driver 52 is linked to the boat holding stage 51 by a vertical travel shaft 53 which is disposed penetrating through a bottom central portion of the main container part 32. The boat vertical travel driver 52 moves the vertical travel shaft 53 in the vertical direction in accordance with an operation instruction from the controller 4, whereby the substrate boat 5 is positioned. The boat vertical travel driver 52 and the vertical travel shaft 53 thus constitute "vertical travel driving means" of the present invention, according to the first preferred embodiment.

A bellow 54 is disposed so that the vertical travel shaft 53 is attached penetrating the main container part 32. The bellow 54 stretches and shrinks as the substrate boat 5 and the boat holding stage 51 ascend and descend. As shown in FIG. 1, the bellow 54 links a portion of the main container part 32 around a through hole to the boat holding stage 51 as if to sheathe the vertical travel shaft 53, thereby isolating the boat vertical travel driver 52 and the vertical travel shaft 53 from the processing chamber 31. This obviates leakage of a liquid component, a fluid component, a vapor component and the like which are inside the processing chamber 31, and prevents contaminants (dirt, dust, etc.) generated at the time of ascending and descending described above from entering into the processing chamber 31.

Considering generally recognized inferior pressure-resistance of the bellow 54, this embodiment requires that a seal member 55 is attached to the bottom surface of the boat holding stage 51. Hence, when the substrate boat 5 and the boat holding stage 51 are positioned to the drying position, the seal member 55 comes into a tight contact with an inner circumferential surface of the main container part 32, and the bellow 54 gets isolated from the processing chamber 31. This prevents the SCF whose temperature and pressure are high from contacting the bellow 54 during high pressure drying, and allows to use a conventional bellow which is in a popular use.

Although not shown in the drawings, there are three through holes in the main container part 32 within the pressure container 3, which connect through the processing chamber 31. Each one of the through holes is located in a lower side of the main container part 32, so as to be below the substrate boat 5 even when the substrate boat 5 and the boat holding stage 51 are positioned at the lowest position (drying position). A anti-drying liquid supply source 62 is connected to one of the through holes via a valve 61, so that when the valve 61 is opened in response to an open/close instruction received from the controller 4, an anti-drying liquid is supplied to the processing chamber 31 and a pool of liquid L is created. The valve 61 and the anti-drying liquid supply source 62 constitute "atmosphere creating means" of the present invention, according to the first preferred embodiment.

In the first preferred embodiment, since a supply position for supplying the anti-drying liquid is located on the bottom side to the processing chamber 31, it is possible to effectively prevent a splash of the liquid at the initial stage that supply of the anti-drying liquid is started, and further, to allow a liquid surface LL of the pool to quietly rise after this. Further, according to the first preferred embodiment, a liquid containing the same components as the rinse liquid, which is used in the processing units 232, 233, 242 and 243, is used as the anti-drying liquid which will create the pool L which serves as an anti-drying atmosphere.

A waste liquid collector 73 is connected to the other through holes respectively via valves 71 and 72 as shown in the drawings. This permits to drain the anti-drying liquid at the bottom most portion of the processing chamber 31 when the valve 71 is opened based on the open/close instruction received from the controller 4. And when the valve 72 is opened, the anti-drying liquid is drained at a seal contacting position, which is slightly higher than the bottom most portion. The seal contacting position corresponds to a position at which the seal member 55 contacts the inner circumferential surface of the main container part 32 when the substrate board 5 and the board holding stage 51 are positioned at the drying position. Hence, even when a pool is created in the vicinity of the seal member 55 with the substrate board 5 and the board holding stage 51 positioned at the drying position (FIG. 4E), it is possible to drain the anti-drying liquid out from the pool without fail when the valve 72 is opened. The valves 71 and 72 and the waste liquid collector 73 function as "atmosphere removing means" of the present invention which removes the anti-drying atmosphere from the processing chamber 31 at appropriate timing, according to the first preferred embodiment.

An SCF collector 75 is also connected to the through holes located at the seal contacting position via a valve 74. Hence, when the valve 74 is opened based on the open/close instruction received from the controller 4, it is possible to collect the SCF from the processing chamber 31.

Meanwhile, a through hole (not shown) connecting through the processing chamber 31 is formed in the top lid 33 of the pressure container 3, and an SCF introducer 8 for introducing the SCF to the processing chamber 31 is connected to this through hole. The SCF introducer 8 comprises a tank 81 which holds liquefied carbon dioxide. Liquefied carbon dioxide supplied from the tank 81 is pressurized by a booster 82 to obtain high pressure liquefied carbon dioxide, and high pressure liquefied carbon dioxide is fed under pressure to the pressure container 3 via a heater 83 and a valve 84. Also connected to this through hole via a valve 85 is a supply source (not shown) for supplying normal pressure gas which contains the same components as the SCF, namely, carbon dioxide gas. Hence, when the valve 84 is opened and the valve 85 is closed based on the open/close instruction received from the controller 4, the SCF is introduced into the processing chamber 31 for execution of high pressure drying. On the contrary, when the valve 84 is closed and the valve 85 is opened, normal pressure gas is introduced into the processing chamber 31 for purging of a liquid component, a vapor component and the like which remain inside the processing chamber 31.

Although the first preferred embodiment requires to use an SCF of supercritical carbon dioxide as a processing fluid, a mixture of supercritical carbon dioxide and a chemical agent may be introduced into the processing chamber 31 as a processing fluid. A chemical agent proper for drying is preferably a compatibilizer which can act as an auxiliary which dissolves or uniformly diffuses the components of the anti-drying liquid in the SCF. Such a chemical agent is not particularly limited to any substance as far as the chemical agent can make the components of the anti-drying liquid compatible with the SCF, but is preferably alcohol, such as methanol, ethanol and isopropanol, and alkyl sulfoxides such as dimethyl sulfoxide which are generally called surfactants.

A description will now be given on overall operations of the substrate processing apparatus comprising the high pressure drying units 231 and 241 whose structure is as described above and operations of the high pressure drying units 231 and 241. In this substrate processing apparatus, substrates W housed in the cassette 11, after unloaded by the indexer robot 14, are transferred to the main transportation robot 22. Receiving the substrates W which have not been processed yet, the main transportation robot 22 moves to any one processing unit of the developing units 232, 233, 242 and 243, and loads the substrates W into this processing unit. After the one unit among the developing units 232, 233, 242 and 243 develops and rinses the substrates W, the main transportation robot 22 wet-transports thus processed substrates W now wet with the rinse liquid one by one to either one of the high pressure drying units 231 and 241. On the other hand, the high pressure drying unit 231 or 241, as described below, performs supercritical drying, which is high pressure drying, on the plurality of substrates W all at once. As the drying completes, the main transportation robot 22 unloads the substrates W from the high pressure drying unit 231 or 241 and transfers the substrates W to the indexer robot 14. The indexer robot 14 then houses thus received substrates W back to the cassette 11 which used to hold these substrates W.

Figure 3:
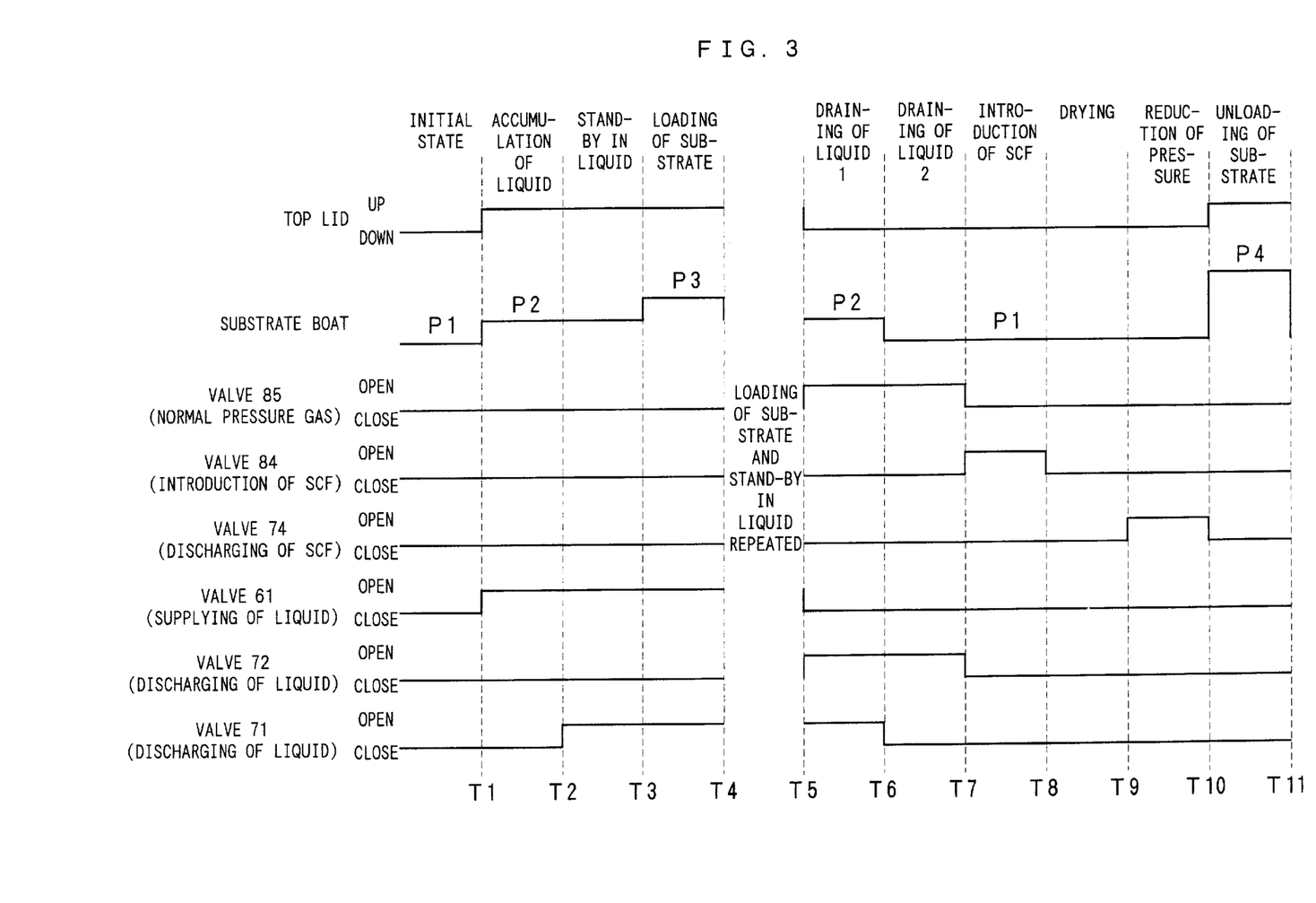
FIG. 3 is a timing chart which shows operations of the high pressure drying unit shown in FIG. 2.

FIG. 3 is a timing chart which shows operations of the high pressure drying unit which is shown in FIG. 2, while FIGS. 4A through 4F are schematic drawings which show the operations of the high pressure drying unit which is shown in FIG. 2. When the high pressure drying unit stays in an initial state, as shown in FIG. 4A, the processing chamber 31 is tightly closed with the top lid 33 descended. Further, in the processing chamber 31, the substrate boat 5 is positioned at the lowest position P1 (which is the position in FIG. 4A). All valves 61, 71, 72, 74, 84 and 85 remain closed.

As an operation start instruction is fed to the high pressure drying unit from a host computer (not shown) of the substrate processing apparatus at the proper timing T1, the controller 4, receiving the instruction, controls the respective portions of the unit as described below to thereby execute supercritical drying on the substrates W.

First, at the timing T1, the top lid 33 is moved upward, and the substrate boat 5 and the boat holding stage 51 are moved upward and positioned to an intermediate position P2, as shown in FIG. 4B. At the same time, the valve 61 is opened, supply of the anti-drying liquid into the processing chamber 31 is started, and the pool L is created within the processing chamber 31. The liquid surface LL of the pool L rises gradually as time passes, and when the liquid surface LL arrives at a predetermined position, which may be immediately below the top circumference of the main container part 32 for example (timing T2), the valve 71 is opened and the anti-drying liquid is accordingly discharged at the bottom most portion of the processing chamber 31 at a flow rate which is approximately the same as the incoming rate of the anti-drying liquid which is supplied into the processing chamber 31. This causes the liquid surface LL of the pool L to remain constant. Instead of opening the valve 71 at the timing T2, the valve 61 may be closed to stop the supply of the anti-drying liquid. Whichever sequence is used, the pool L having a predetermined liquid surface is created as the anti-drying atmosphere within the processing chamber 31.

As the pool L is created in this manner, the high pressure drying unit waits for arrival of substrates W transported from the developing unit (stand-by in liquid). When the main transportation robot 22 (FIG. 1) transports the substrates W from the developing unit (timing T3), the substrate boat 5 and the boat holding stage 51 are temporarily moved upward and positioned to a substrate receiving position P3, and the main transportation robot 22 loads the substrates W into the substrate boat 5 (FIG. 4C). Upon loading of the substrates (timing T4), the substrate boat 5 and the boat holding stage 51 are moved toward below and positioned to the intermediate position P2 once again. This dips the substrates W wet-transported by the main transportation robot 22 in the pool L which serves as the anti-drying atmosphere, and therefore, effectively prevents air drying of the surfaces of the substrates W.

The "stand-by in liquid" operation and the "loading of substrate" operation are repeated for every one of the predetermined number of substrates. During this, the substrates W already housed in the substrate boat 5 remain on stand-by always in the liquid, thereby preventing air drying of the substrates W without fail during this stand-by period as well.

When the predetermined number of substrates W get housed in the substrate boat 5 (timing T5), as shown in FIG. 4D, the top lid 33 is moved to below, the processing chamber 31 is accordingly tightly closed, and 2-stage draining ("draining of liquid 1" and "draining of liquid 2") is carried out, whereby the anti-drying atmosphere is removed from the processing chamber 31. To be more specific, the valve 61 is closed and the supply of the anti-drying liquid into the processing chamber 31 is stopped, concurrently with which the valve 72 is further opened and draining of the anti-drying liquid is started at the seal contacting position, too. In this manner, liquid draining ("draining of liquid 1") is executed during which the anti-drying liquid is drained from the processing chamber 31 through the two through holes. In addition, according to the first preferred embodiment, the valve 85 is opened at the timing T5, thereby introducing normal pressure carbon dioxide gas into the processing chamber 31 and promoting draining of liquid, while the atmosphere inside the processing chamber 31 is replaced with the same component of the SCF, namely, the carbon dioxide atmosphere.

Following this, the substrate boat 5 and the boat holding stage 51 are moved further downward at the timing T6 and positioned to the lowest position (drying position) P1, and discharging of the anti-drying liquid from the seal contacting position is continued ("draining of liquid 2") with the valve 71 closed but the valve 72 remaining open. This is for the purpose of reliable draining, since the anti-drying liquid may remain, although in a very small amount, at the seal contacting position when the substrate boat 5 and the boat holding stage 51 are positioned to the lowest position P1. In this respect, for further reliable removal of the anti-drying liquid remaining at the seal contacting position, it is desirable to dispose sucking means, such as an ejector, to a piping system which is connected to the seal contacting position.

As the anti-drying atmosphere is replaced with the carbon dioxide atmosphere inside the processing chamber 31 (timing T7), the valve 72, too, is closed and the processing chamber 31 is accordingly made airtight, and the valve 85 is then closed and the valve 84 is opened, to thereby start introducing the SCF into the processing chamber 31 (FIG. 4E). After continuing the introduction of the SCF until the pressure inside the processing chamber 31 has reached a predetermined value (up until the timing T8), the valve 84 is closed and the introduction of the SCF is stopped. Following this, as a predetermined period of time has elapsed, the valve 74 is opened only for a certain period of time, the SCF inside the processing chamber 31 is collected into the SCF collector 75, and the pressure inside the processing chamber 31 is accordingly reduced. Thus collected SCF is separated into a gas component (carbon dioxide) and a liquid component and the gas component is thereafter re-used, to thereby improve the recycle efficiency of carbon dioxide and decrease a running cost. Further, while the foregoing has described that the processing chamber 31 is sealed completely airtight after the introduction of the SCF, the introduction of the SCF and discharging of the SCF may be continued while adjusting the pressure on the SCF discharging side while keeping the processing chamber 31 in the airtight condition.

Figure 4F:
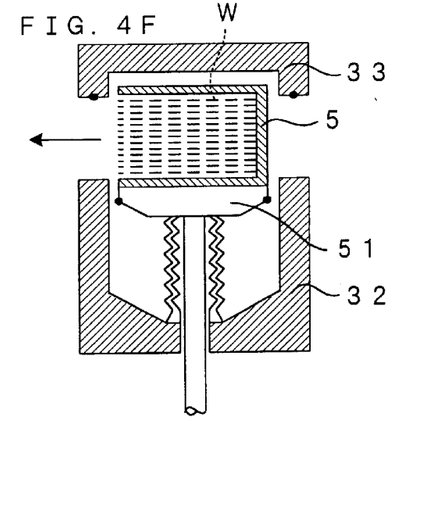

When the supercritical drying completes in this manner, as shown in FIG. 4F, the top lid 33 is moved upward, the substrate boat 5 and the boat holding stage 51 are moved upward, and all substrates W are positioned to a position which permits unloading (unloading position). The main transportation robot 22 unloads all of thus dried substrates W, following which the high pressure drying unit returns to the initial state once again.

As described above, according to the first preferred embodiment, a plurality of substrates W are subjected all at once to supercritical drying inside the processing chamber 31, that is, supercritical drying is performed as batch processing, and therefore, the throughput dramatically improves as compared to a conventional apparatus which performs single wafer processing.

Further, since the pool L is created inside the processing chamber 31 as the anti-drying atmosphere and substrates W stay on stand-by in a condition that they are dipped in the pool L, air drying of the substrates W which remain on stand-by is prevented, which in turn realizes batch-type supercritical drying.

In addition, the operation of keeping the substrates W on stand-by and the supercritical drying are performed in the same processing chamber 31, and hence, there is an advantage in terms of footprint and apparatus cost.

Figure 5:
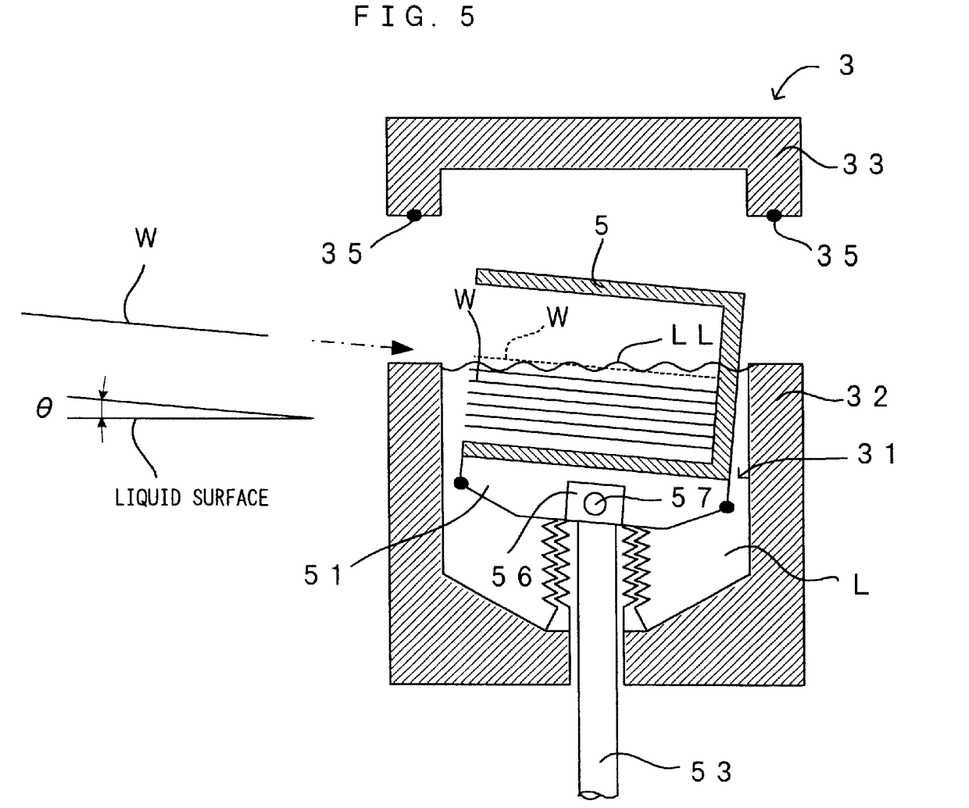
FIG. 5 is a drawing of a high pressure drying unit which is a second preferred embodiment of the high pressure drying apparatus according to the present invention.

FIG. 5 is a drawing of a high pressure drying unit which is a second preferred embodiment of the high pressure drying apparatus according to the present invention. A large difference of this high pressure drying unit from the first preferred embodiment is that: the second preferred embodiment requires a link 56 comprising a horizontal shaft 57 links the boat holding stage 51 and the vertical travel shaft 53; and the substrate boat 5 is disposed at a fixed angle θ. The structures are otherwise the same.

After positioned to the substrate receiving position for the purpose of loading of substrates, the substrate boat 5 is inclined at the angle θ such that the open side of the substrate boat 5 (the left-hand side in FIG. 5) will be directed toward above. Meanwhile, the main transportation robot 22 (FIG. 1) transports substrates W toward the substrate boat 5 along the direction of the inclination (the dashed line in FIG. 5). After loading in this manner, the substrate boat 5 is moved down to the pool L which is the anti-drying atmosphere. Other basic operations are exactly the same as those in the first preferred embodiment, and therefore, will not be described again.

As described above, according to the second preferred embodiment, substrates W are loaded as they are tilted into the substrate boat 5 in addition to the structures according to the first preferred embodiment. Hence, in addition to the effects promised by the first preferred embodiment, the second preferred embodiment realizes an effect that it is possible to suppress resistance by the anti-drying liquid at the time of entry into the pool L since the substrates W are transported at the acute angle θ with respect to the liquid surface LL of the pool L.

The present invention is not limited to the preferred embodiments described above, but may be modified in various manners other than those described above to the extent not deviating from the intent of the invention. For instance, while the preferred embodiments described above require to supply the anti-drying liquid into the processing chamber 31 and create the pool L as the anti-drying atmosphere inside the processing chamber 31, a vapor of the anti-drying liquid may be supplied into the processing chamber 31 and have the resulting vapor atmosphere serve as the anti-drying atmosphere. In the structure which uses a vapor of the anti-drying liquid, in the process of creating the anti-drying atmosphere, the high pressure drying unit preferably operates in the following operation sequence, in an attempt to shorten as much as possible a period of time during which the top lid 33 is moved up and the processing chamber 31 is released from the airtight condition.

Figure 6:
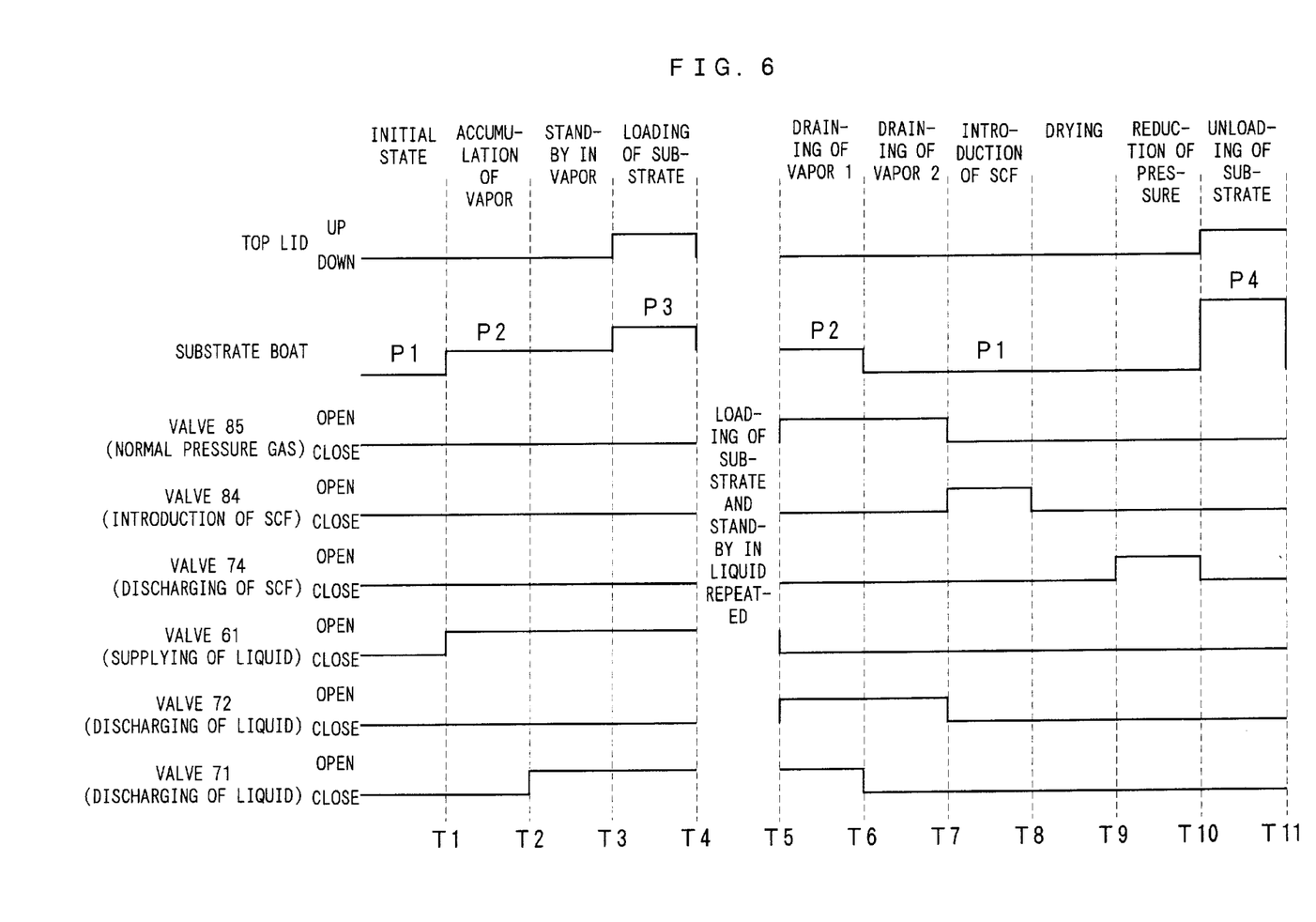
FIG. 6 is a timing chart which shows operations of a high pressure drying unit which is a third preferred embodiment of the high pressure drying apparatus according to the present invention.

FIG. 6 is a timing chart which shows operations of a high pressure drying unit which is a third preferred embodiment of the high pressure drying apparatus according to the present invention. A large difference of the third preferred embodiment from the first preferred embodiment is that the third preferred embodiment requires to move down the top lid 33 and close the processing chamber 31 airtight during "accumulation of vapor" and "stand-by in vapor" which are for supplying of a vapor of the anti-drying atmosphere into the processing chamber 31, as shown in FIG. 6. The structures are otherwise the same. By means of such a structure that the top lid 33 moves upward only during loading of substrates, it is possible to minimize outflow of the vapor of the anti-drying liquid from the processing chamber 31 and suppress an increase in running cost.

Meanwhile, in the structure which uses a vapor of the anti-drying liquid to create the anti-drying atmosphere, since it is not necessary to consider the problem of splashing of liquid, supplying of the vapor provides a higher level of freedom than supplying of the liquid does (the first and the second preferred embodiments). Further, any desired number of vapor supplies may be disposed at any desired locations.

In addition, the foregoing has described the preferred embodiments above in relation to an example of transportation of substrates W, as they are wet with the rinse liquid, which were developed and rinsed by the developing unit 232, 233, 242 or 243. Pure water or deionized water DIW is often used as a rinse liquid during development which uses an alkaline developing liquid for instance, in which case pure water may be used as the anti-drying liquid in the high pressure drying units. Meanwhile, isopropyl alcohol (IPA) is often used as a rinse liquid during development which uses an organic developing liquid, in which case isopropyl alcohol may be used as the anti-drying liquid in the high pressure drying units. Further, a substitution liquid such as alcohol is supplied after rinsing in some processes, and noting this, a substitution liquid may be used as the anti-drying liquid instead of a rinse liquid.

For example, after supplying pure water or deionized water DIW as a rinse liquid, an organic solvent or other solvent which is inert and exhibits excellent affinity to supercritical carbon dioxide at a low vapor pressure, such as a fluorocarbon-containing chemical liquid, may be used as a substitution liquid. This eliminates the necessity of using a compatibilizer with the SCF.

In addition, although the preferred embodiments above are directed to an application of the present invention to a substrate processing apparatus which comprises a developing unit as a wet-processing unit, applications of the present invention are not limited to this. The present invention is also applicable to a substrate processing apparatus which comprises such a wet-processing unit which performs a wet surface treatment, such as etching and washing, using a processing liquid such as an etchant liquid and a washing liquid. For instance, a washing unit (wet-processing unit) which washes dry-etched and ashed substrates often uses isopropyl alcohol (IPA) as a rinse liquid after washing of substrates with a polymer removing liquid, in which case isopropyl alcohol may be used as the anti-drying liquid in the high pressure drying units. Meanwhile, in an etching unit (wet-processing unit) which etches substrates bearing oxide film patterns, after etching using a diluted hydrofluoric acid and subsequent rinsing using pure water or deionized water DIW, substitution of liquid is often executed using an organic solvent, such as isopropyl alcohol (IPA), as a substitution liquid. In such a case, a substitution liquid may be used as the anti-drying liquid in the high pressure drying units.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A high pressure drying apparatus, comprising:
   a pressure container whose inside is a processing chamber;
   substrate housing means which is capable of housing a plurality of substrates inside said processing chamber;
   atmosphere creating means which provides said processing chamber with an anti-drying liquid for prevention of drying of surfaces of substrates or a vapor of said anti-drying liquid, to thereby create an anti-drying atmosphere;
   atmosphere removing means which removes said anti-drying atmosphere from said processing chamber; and
   processing fluid introducing means which introduces into said processing chamber a high pressure fluid or a mixture of a high pressure fluid and a chemical agent as a processing fluid,
   wherein after more than one substrate among substrates transported to said processing chamber are housed in said substrate housing means and made on stand-by in said anti-drying atmosphere, said more than one substrate housed in said substrate housing means are subjected all at once to high pressure drying.

2. The high pressure drying apparatus of claim 1, wherein said atmosphere removing means removes said anti-drying atmosphere from said processing chamber in which a plurality of substrates are housed, and said processing fluid introducing means introduces said processing fluid into said processing chamber to execute high pressure drying.

3. The high pressure drying apparatus of claim 1, wherein said more than one substrate are transported to said processing chamber as they are wet with a predetermined liquid on surfaces, and wherein as said anti-drying liquid, said atmosphere creating means uses a liquid containing the same components as said predetermined liquid.

4. The high pressure drying apparatus of claim 1, wherein said atmosphere creating means supplies said anti-drying liquid to said processing chamber, to thereby create a pool of said anti-drying liquid as said anti-drying atmosphere.

5. The high pressure drying apparatus of claim 4, wherein said atmosphere removing means collects said anti-drying liquid which constitutes said anti-drying atmosphere and accordingly removes said anti-drying atmosphere from said processing chamber.

6. The high pressure drying apparatus of claim 5, wherein said atmosphere removing means feeds the collected anti-drying liquid to said atmosphere creating means so that the collected anti-drying liquid will be used again.

7. The high pressure drying apparatus of claim 1, wherein said atmosphere creating means supplies a vapor of said anti-drying liquid to said processing chamber, to thereby create a vapor atmosphere as said anti-drying atmosphere.

8. The high pressure drying apparatus of claim 7, wherein said atmosphere removing means collects a vapor of said anti-drying liquid which constitutes said anti-drying atmosphere and accordingly removes said anti-drying atmosphere from said processing chamber.

9. The high pressure drying apparatus of claim 8, wherein said atmosphere removing means feeds the collected vapor to said atmosphere creating means so that the collected vapor will be used again.

10. The high pressure drying apparatus of claim 1, wherein said substrate housing means receives and holds substrates transported to said processing chamber as they are oriented horizontally.

11. The high pressure drying apparatus of claim 1, wherein said substrate housing means is capable of receiving substrates transported to said processing chamber as they are inclined at an acute angle with respect to the top surface of said anti-drying atmosphere.

12. The high pressure drying apparatus of claim 1, further comprising:

vertical travel driving means which makes said substrate housing means ascend and descend between a substrate receiving position for receipt of substrates transported to said processing chamber and a drying position for execution of high pressure drying; and a bellow which stretches and shrinks in accordance with ascending and descending of said substrate housing means, while isolating said vertical travel driving means from said processing chamber.

13. The high pressure drying apparatus of claim 12, further comprising: a seal member which is attached to said substrate housing means, comes into a tight contact with an inner circumferential surface of said pressure container when said substrate housing means is positioned at said drying position, and isolates said bellow from said processing chamber.

14. A substrate processing apparatus, comprising:

a high pressure drying unit whose structure is the same as that of the high pressure drying apparatus of claim 1;

a plurality of wet-processing units which supply a processing liquid onto each substrate and perform a predetermined wet surface treatment of the single wafer type; and a substrate transporting unit which wet-transports to said high pressure drying apparatus substrates which were subjected to the wet surface treatment by said wet-processing units.

15. A high pressure drying method, comprising:

a first step of supplying an anti-drying liquid, which prevents drying of surfaces of substrates, or a vapor of said anti-drying liquid to a processing chamber of a pressure container and creating an anti-drying atmosphere inside said processing chamber;

a second step of receiving substrates transported to said processing chamber and making said substrates on stand-by in said anti-drying atmosphere; and a third step of removing said anti-drying atmosphere from said processing chamber after repeating said second step for a plurality of times, introducing a high pressure fluid or a mixture of a high pressure fluid and a chemical agent into said processing chamber as a processing fluid, and subjecting said substrates all at once to high pressure drying.

* * * * *